United States Patent [19]

Moll

[11] Patent Number: 5,258,715
[45] Date of Patent: Nov. 2, 1993

[54] CIRCUIT ARRANGEMENT FOR SELECTIVELY AMPLIFYING SIGNALS

[75] Inventor: Holger Moll, Hamburg, Fed. Rep. of Germany

[73] Assignee: U.S. Philips Corp., New York, N.Y.

[21] Appl. No.: 960,190

[22] Filed: Oct. 9, 1992

Related U.S. Application Data

[63] Continuation of Ser. No. 724,100, Jul. 1, 1991, abandoned.

[30] Foreign Application Priority Data

Jul. 4, 1990 [DE] Fed. Rep. of Germany ....... 4021290

[51] Int. Cl.$^5$ .............................................. H03F 1/14
[52] U.S. Cl. ....................................... 330/51; 330/298
[58] Field of Search ............... 330/51, 69, 86, 298, 330/207 P; 358/184

[56] References Cited

U.S. PATENT DOCUMENTS

| | | | |
|---|---|---|---|
| 3,781,912 | 12/1973 | McCollum | 330/51 |
| 3,995,227 | 11/1976 | Lefevrë | 330/86 X |
| 4,546,324 | 10/1985 | Bingham et al. | 330/51 X |
| 5,142,238 | 8/1992 | White | 330/51 X |

*Primary Examiner*—Steven Mottola
*Attorney, Agent, or Firm*—Steven R. Biren

[57] ABSTRACT

A circuit arrangement for optionally amplifying one of two signals (from 2 or 6 respectively) in which at least one of the signals is supplied via a switchable signal path interruption which is inhibited when no signal is applied thereacross, and to which in this state a signal voltage is applied to both ends, which is associated with the signal to be amplified and which has already been amplified, respectively. When such a structure of a circuit arrangement is used, no damage to the circuit structure can occur, even when a signal path is interrupted in normal operation.

3 Claims, 3 Drawing Sheets

CIRCUIT ARRANGEMENT FOR SELECTIVELY AMPLIFYING SIGNALS

This is a continuation of application Ser. No. 07/724,100, filed Jul. 1, 1991 now abandoned.

BACKGROUND OF THE INVENTION

The invention relates to a circuit arrangement for optionally (i.e. selectively) amplifying one of at least two signals.

Circuit arrangements of this type can, for example, be used in video signal processing circuits in which video signals from different video signal sources are processed for conveyance to a video signal sink. Generally however, their use in the processing of any type of signals is alternatively possible.

With such a junction of signal paths from different signal sources to a signal sink, it may be recommendable to interrupt in a predetermined operating state signal sources to which at that instant no signals are applied from the associated signal sources. In the inhibited state, the voltage difference between the signals from the signal source of the interrupted signal path and the signal voltage of the operative signal source is superimposed on such signal path interruptions which are of the switchable type. These voltage differences are composed from the amplitudes of any signal voltages assigned to the signals as well as potential differences in the signal path and can assume considerable values. The switchable signal path interruptions must then be structured such that they are capable of withstanding these voltages.

Preferably, circuit arrangements of the defined type are provided in integrated circuits on semiconductor bodies which as regards their geometry and their manufacturing process must first of all be designed such that they enable a signal processing which has the shortest possible delay and the lowest possible power. The individual circuit elements of integrated circuits of this type can often be loaded with only a very low electric voltage. If a switched-mode signal interruption is implemented in this technique, there is a risk of voltage breakdowns and consequently the destruction of the integrated circuit.

SUMMARY OF THE INVENTION

The invention has for its object to provide a circuit arrangement for optionally amplifying signals such that also when in normal operation a signal path is interrupted, no harmful effects on the circuit structure can occur.

To that end, according to the invention, a circuit arrangement for optionally amplifying one of at least two signals is provided, at least one of which is supplied via a switchable signal path interruption which is inhibited when no signal is applied thereacross, and to both ends of which in this state a signal voltage is applied which is associated with the signal to be amplified and a signal voltage which is associated with the amplified signal, respectively.

The measures in accordance with the invention provide that the voltage difference at the signal path interruptions are reliably limited to an acceptable degree, independently of the operative individual signal variations. Consequently, using the circuit arrangement of the invention, it is possible to process signals which attract signal voltages which exceed the cut-off voltages, for which the signal part interruptions are designed.

Preferably, the circuit arrangement of the invention includes a switching arrangement which assumes the conductive state which is always opposite to the signal path interruption and via which the signal voltage is applied to at least one side of the signal path interruption. This switching arrangement ensures that the signal voltage is always applied to the signal path interruption or signal path interruptions, respectively, in the inhibited state and that also a feedback loop via the signal path interruption in the conducting state is prevented. Conversely, the signal voltage is advantageously applied to at least one side of the switching arrangement in its inhibited state via the conducting signal path interruption. In this further development of the invention the switching arrangement and the signal path interruption or signal path interruptions, respectively, serve as oppositely acting safety arrangement for preventing excessive signal voltages.

The circuit arrangement of the invention may preferably include a current amplifier to whose input optionally one of the signal currents is applied and from whose output the amplified signal current is taken. Such a current amplifier increases the amplitude of the signal currents applied to its input, in contrast to which the signal voltage associated with this signal current remains the same to an at least significant extend. As a result thereof the difference between the signal voltage associated with the signal current to be amplified on the one hand and the signal voltage associated with the amplified signal current on the other hand is small; it comprises, particularly in certain embodiments of the signal amplifier, in essence only a constant potential shift. As such a potential shift is easy to compensate for, the signal voltage associated with the signal current to be amplified can be applied to one side of the signal path interruption or signal path interruptions, respectively, and the signal voltage associated with the amplified signal current can be applied to always the other side.

Preferably, the current amplifier is in the form of a straight amplifier, i.e. an amplifier without feedback. Compared with an operational amplifier, the straight amplifier has a reduced tendency to oscillate, which tendency usually requires compensation measures using RC members in operational amplifiers. The straight amplifier is thereof of a simpler structure. More specifically, such a structure can advantageously be used in combination with one or a plurality of signal path interruptions comprising a transistor which preferably is arranged as an emitter follower. An emitter follower can effectively be used as a current amplifier, whose voltage gain is equal to 1 in the ideal case. Moreover, the signal paths can be switched in a simple manner via the emitter followers. A particularly effective component is obtained when the transistor is of the npn type, as these transistors have a higher current gain. On the other hand, these transistors in particular are particularly sensitive to high cut-off voltages, which can be efficiently remedied by the measures according to the invention.

In an advantageous further development the signal path interruption is switched to the conducting state, also when the switching arrangement is conducting, when the signal voltage exceeds or falls short of a predetermined threshold value. This structure renders the signal path interruption additionally suitable for use as amplitude or overload limiter for the signal to be amplified and the associated signal voltage, at low cost. In a structure of the circuit arrangement in accordance with the invention, structured in the customary manner with transistors, it is thus possible to prevent in a simple manner saturation states and delay times determined thereby at the signal transmission.

The circuit arrangement in accordance with the invention can advantageously be used in a signal output stage for video signal processing.

DESCRIPTION OF THE PREFERRED EMBODIMENTS

Figure 1:
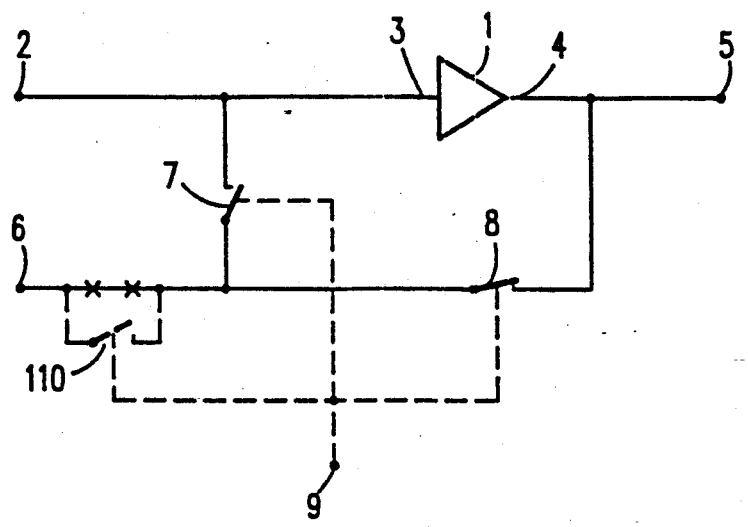
FIG. 1 is a basic block circuit diagram of the circuit arrangement of the invention.

The basic circuit diagram of FIG. 1 comprises a first amplifier 1 to whose input 3 a first signal current to be amplified is applied from a first signal input 2. From its output 4 the current amplifier 1 supplies an amplified signal current which is applied to the signal output 5. The current amplifier 1 is of such a structure, that the signal voltage associated with the signal current remains at least in essence unchanged.

Optionally, a second signal to be amplified is applied from a second signal input 6 to the input 3 of the current amplifier 1 via a signal path interruption 7 which in FIG. 1 is constituted by a switch. In the operating state of the circuit arrangement shown in FIG. 1, the switchable signal path interruption 7 is inhibited, so that only the signal current flowing across the first signal input 2 is amplified. Only the signal voltage associated with the signal current to be amplified then occurs at the first input, while without further measures the potential at the second signal input 6 is kept independent therefrom and at, for example, a constant value. Across the signal path interruption 7 a voltage difference is then present which when it exceeds a value determined by the construction type of the signal path interruption 7 might result in a negative influence on its functioning or in the worst case to its destruction.

Therefore, a connection which is interruptable by means of a switching arrangement 8 is provided between the signal output 5 and that terminal of the signal path interruption 7 that faces the second signal input 6. In FIG. 1 the switching arrangement 8 is also shown as a switch and is conductive in the operating state shown. Via a control terminal 9, which is used in common with the control of the signal path interruption 7, the switching arrangement 8 is controlled such that it always assumes the conduction state opposite to that of the signal path interruption 7. In the operating state shown, the signal voltage is then applied from the output 4 of the current amplifier 1 to one side of the signal path interruption 7 via the switching arrangement 8, and more specifically to the side facing the signal input 6, while the signal voltage associated with the signal current to be amplified present at the first signal input 2 is then present at that side of the signal path interruption 7 that faces the first signal input 2. As these voltages in essence correspond to each other, the voltage difference at the signal path interruption 7 is very small.

Thus, negative influences on the mode of functioning or destruction of the signal path interruption 7 are effectively eliminated.

For the case in which a signal is only supplied from the second signal input 6 and the first signal input 2 is switched to the inoperative state, the signal path interruption 7—which is connected via the control terminal 9—is in the conducting state and the switching arrangement 8 is in the inhibited state. Then no voltage difference which might result in a negative influence on the mode of functioning or destruction thereof occurs anymore at the signal path interruption 7. The switching arrangement 8 is at the same time in the inhibited state. The signal voltage associated with the signal current to be amplified is applied to the switching arrangement via one of its terminals and the signal voltage associated with the amplified signal current is applied to the other terminal. As in essence these voltages correspond to each other, there is no risk of damage to the switching arrangement 8, so that this switching arrangement can be structured in a manner corresponding to that of the signal path interruption 7. In this operating state a current to be amplified can be supplied from both the first signal input 2 and from the second signal input 6. In the first case the switching arrangement 8 receives in its inhibited state at one side the signal voltage of the signal current to be amplified via the signal path interruption 7 which is then in the conducting state.

Figure 3:
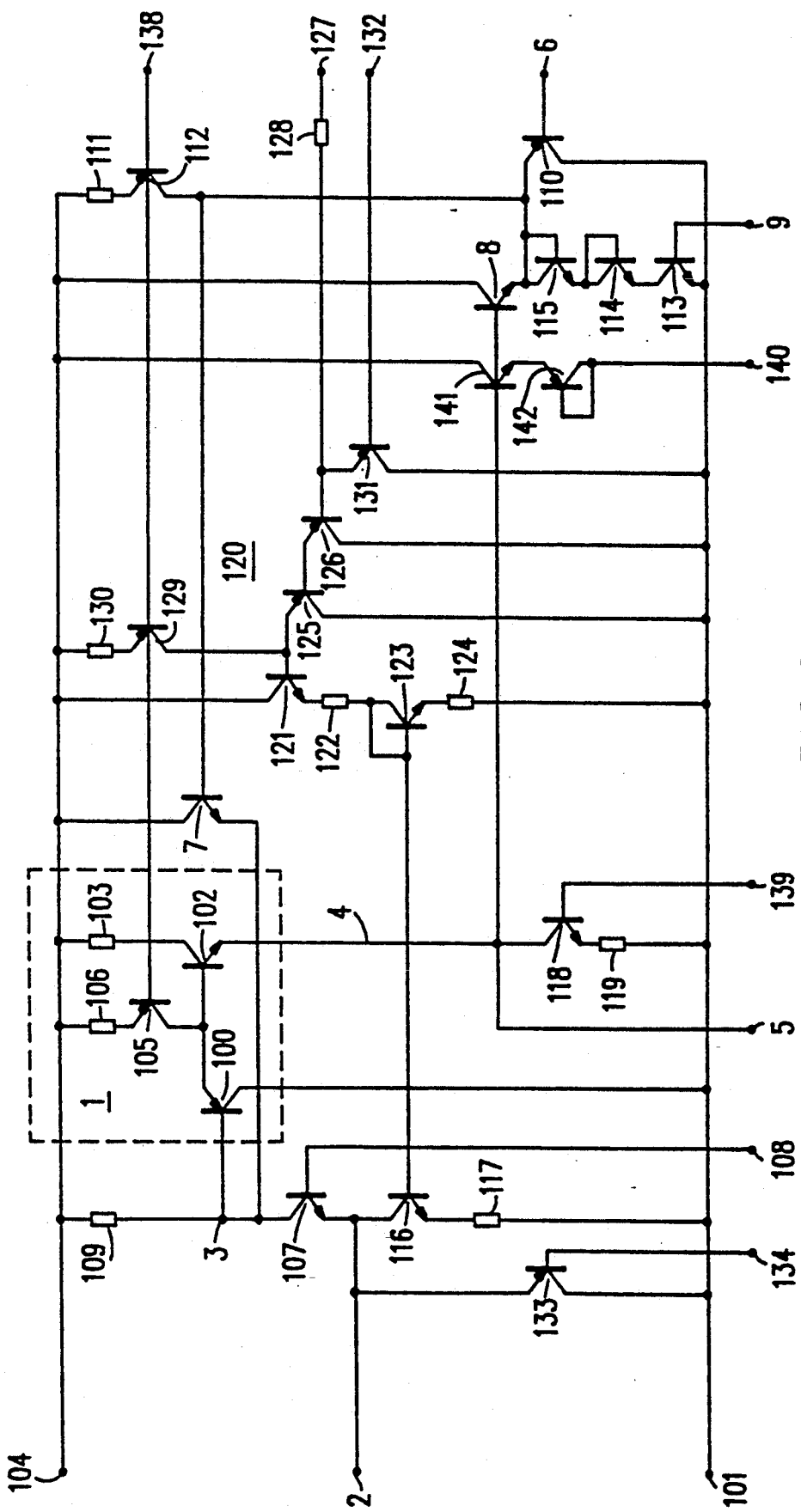
FIG. 3 is a detailed view of an embodiment of the invention.

In the detailed circuit diagram shown in FIG. 3, in which elements corresponding to those shown in FIG. 1 are given the same reference numerals, the current amplifier 1 is constituted as a straight amplifier incorporated in an integrated circuit on a semiconductor body. It includes a first pnp amplifier transistor 100 arranged in a grounded-collector configuration, whose base terminal is connected to the input 3, its collector terminal to a grounded terminal 101 and its emitter terminal to the base terminal of a subsequent second amplifier transistor 102. The second amplifier transistor 102 has its collector terminal connected to a power supply terminal 104 via a collector resistor 103 and its emitter terminal to the output 4 of the current amplifier 1. Via a current source transistor 105, which is preceded by an emitter resistor 106 the connection between the first and the second amplifier transistor 100 and 102, respectively, is supplied with current from the power supply terminal 104. The amplified signal current supplied by the second amplifier transistor 102 is directly applied to the signal output 5 via the output 4.

Optionally, one of the signal from the first signal input 2 or from the second signal input 6 is applied to the current amplifier 1 via its input 3. The first signal is conveyed via a npn-transistor 107 which is arranged in the grounded-base connection configuration and to whose base terminal 108 a fixed reference potential is applied. Whereas the emitter terminal of the transistor 107 is connected to the first signal input 2, the collector terminal connected to the input 3 is connected to the power supply terminal 104 via a collector resistor 109. The stage formed by the transistor 107 and the collector resistor 109 provides a decoupling of the first signal input 2 from the input 3.

The second signal from the second signal input 6 is applied via a pnp-transistor 110 whose emitter-collector path is arranged in series with a current source formed by a resistor 111 and a current source transistor 112 between the power supply terminal 104 and the grounded terminal 101, to the base terminal of an npn-transistor constituting the signal path interruption 7 and from the emitter terminal of this npn-transistor arrives at the input 3 of the current amplifier 1. The collector terminal of the transistor constituting the signal path interruption 7 is connected to the power supply terminal 104. The transistor constituting the signal path interruption 7 is consequently connected as an emitter follower.

In the circuit arrangement shown in FIG. 3, the switching arrangement 8 is constituted by a npn-transistor which has its base terminal connected to the signal output 5 and its emitter terminal to the emitter terminal of the pnp-transistor 110 and is connected to the second signal input 6 via this pnp-transistor. The collector terminal is connected to the power supply terminal 104.

The transistor constituting the switching arrangement 8 is alternately switched to the conducting or the non-conducting state by means of a switching voltage applied to the control terminal 9. To that end, this switching voltage is applied in FIG. 3 to the base terminal of a npn switching transistor 113, whose emitter terminal is connected to the grounded terminal 101 and whose collector terminal is connected to the emitter terminal of the transistor constituting the switching arrangement 8 via two npn transistors 114, 115, which are connected as diodes and in series and which serve for shifting the potential. If the switching voltage at the control terminal 9 assumes a high level, the switching transistor 113 and the switching arrangement 8 are conducting. A potential which from the signal output 5 is shifted by the base-emitter voltage of the conducting transistor via the base terminal of the transistor constituting the switching arrangement 8 and which tracks the signal voltage associated with the amplified signal current is then present across the emitter terminal of the transistor 110 and the emitter terminal of the transistor constituting the switching arrangement 8 connected thereto. In this operation condition, the base-emitter path of the npn transistor constituting the signal path interruption 7 is in essence reverse-biased through the base-emitter path of the transistor constituting the switching arrangement 8. As, when the signal varies, both the voltage at the input 3 and also at the output 4 or the signal output 5, respectively, varies in the same direction, the voltage difference at the transistor constituting the signal path interruption 7 always remains constant and in a range which is not dangerous for this transistor. Voltage breakdowns at this transistor or change transfers resulting in saturation effects are effectively prevented thereby.

In the operating condition, in which a second signal is to be applied via the second signal input 6, the control terminal 9 is brought to a low potential. This inhibits the switching transistor 113 and the switching arrangement 8 and current and voltage at the emitter terminal of the pnp transistor 110 are no longer influenced by the diode connected transistors 114, 115.

The current flowing in the transistor 110 via the current source 111, 112 and the second signal at the second signal input 6, then control the voltage a the emitter terminal of the transistor constituting the signal path interruption 7 such that it becomes conductive. The current supplied from its emitter terminal drives the current amplifier 1 via the input 3 in the same manner as is effected by the first signal current from the first signal current input 2 in the other operating condition. From the output 4 and consequently from the signal output 5, the current amplifier 1 supplies an amplified signal current whose associated signal voltage again corresponds to a considerable extent to that of the signal to be amplified but for a small, controllable, constant potential difference.

Consequently, the base-emitter voltage of the transistor which constitutes the signal path interruption 7 and which is in the conducting state is in essence applied between the base terminal and the emitter terminal of the transistor which constitutes the switching arrangement 8 and is now in the inhibited state, more specifically in the reverse direction of the base-emitter transition of the transistor constituting the switching arrangement 8. Also in this operating condition a disadvantageous operating condition of the switching arrangement 8 or destruction of this switching arrangement is effectively prevented thereby. By way of example, with a given process which is advantageous for the production of the circuit described, the then obtainable, maximum permissible reverse bias at the base-emitter transitions of the npn transistors on the semiconductor body amounts to approximately 2.2 V, in contrast whereto the voltage between the base terminal and the emitter terminal of the transistor constituting the signal path interruption 7 is approximately 0.7 V in the conducting state.

The pnp transistor 110 is preferably driven via the second signal input 6 with a potential which is chosen such that, when the switching transistor 113 is conducting, it passes to the inhibited state and consequently a negative influence on the current amplifier 1 and consequently on the signal current at the signal output 5 is effectively prevented. To illustrate this function, the basic circuit diagram of FIG. 1 shows there between the second signal input 6 and the connection between the signal path interruption 7 and the switching arrangement 8 a switch which is schematically shown by means of interrupted lines and which, when the conducting line, indicated by a solid line, from the second signal input 6, is interrupted—indicated by crosses—performs the function of the transistor 110 of FIG. 3. In correspondence with the operating condition shown in FIG. 1, the transistor 110 which is represented by a switch, is shown in the inhibited state. The operating condition is also controlled via the control terminal 9.

In the present embodiment the measure in accordance with the invention is only used to protect the npn transistors. Usually and more specifically in the manufacture process here described as an example, pnp-transistors can be loaded with significantly higher reverse voltages, without damage being caused thereby. Consequently—in a manufacturing process taken by way of example the voltage for the base-emitter breakthrough is higher than 18 V—measures of this type are not necessary for pnp transistors.

The structure of the circuit arrangement of FIG. 3 has still further advantageous functional feature, without any additional circuit cost and design effort, in that the signal path interruption 7 is also adjusted to the conducting state when the switching arrangement 8 conducts when the signal voltage supplied via the first signal input 2 falls short of a predetermined threshold value. In this operating condition the voltage at the base terminal of the transistor constituting the signal path interruption 7 is limited to twice the base-emitter forward voltage by the diode-connected npn transistors 114, 115 which are in the conducting state. If now the signal voltage at the input 3 (and consequently also the voltage at the output 4) drops considerably below the value of a base-emitter forward voltage of a npn transistor used in the circuit arrangement, the voltage difference across the base-emitter path of the transistor constituting the signal path interruption 7 increases such that, in deviation from the preset parameters of the operating conditions, this path becomes conducting. The current now starting to flow through the signal path interruption 7 flows to ground via the npn transistor 107 between the first signal input 2 and the input 3 and further via a transistor 116 and its emitter resistor 117. This prevents the transistor 107 from becoming saturated.

Equally, also the voltage at the output 4 and consequently at the signal output 5 is limited to low values, which prevents a saturation state of a current source which is connected between the input 4 and ground and consists of a transistor 118 with associated emitter resistor 119 from occurring. This avoids saturation effects, as, for example, delay times which occur when the signal voltage at the input 3 and at the output 4 increases again from the saturation state and consequently again blocks the transistor 7 constituting the signal path interruption.

In addition, the arrangement shown in FIG. 3 includes a direct current adjusting circuit 120, through which a supply direct current is fed into the series arrangement formed by the collector resistor 109 and the transistor 107, via the transistor 116. This current is determined by a current source transistor 131 with subsequent emitter resistor 122, which is arranged between the supply voltage 104 and the input branch of a current mirror to ground. The input branch of the current mirror includes a npn transistor 123 which is connected as a diode and is followed by an emitter resistor 124; in addition, the transistor 116 with its emitter resistor 117 forms the output branch of the current mirror.

The current in the current source transistor 121 is controlled via a stage consisting of two pnp transistors 125, 126 which have their collector terminals connected to ground, while the first transistor 126 of this stage is supplied with a setting voltage from a current setting input 127 via a series resistor 128. The base terminal of the second transistor 125 and via its emitter terminal the base terminal of the current source transistor 121 are driven from the emitter terminal of the first transistor 126. For the purpose of current compensation, the emitter terminal of the second transistor 125 is furthermore connected to the supply voltage terminal 104 via a current source formed by a pnp current source transistor 129 with emitter resistor 130. The emitter-collector path of a further pnp transistor 131 leads from the base terminal of the first pnp transistor 126 to the grounded terminal 101. The base terminal of the transistor 131 is fed via the terminal 132 with a predetermined reference voltage.

A corresponding transistor arrangement including a pnp transistor 133, whose base terminal is fed with a fixed reference voltage via a terminal 134, is also arranged between the first signal current input 2 and the grounded terminal 101 for the purpose of voltage limitation.

In addition, in the circuit arrangement shown in FIG. 3, reference voltages are applied to the current sources 105, 106 in connection with 111, 112 and 129, 130 on the one had as well as 118, 119 on the other hand, each via an associated reference voltage terminal 138 or 139, respectively, with the object of setting the current of these current sources.

In addition to the signal output 5, the arrangement of FIG. 3 has a decoupled additional output 140 which is controlled from the output 4 of the current amplifier 1 and is driven via a transistor 141, whose base terminal is connected to the output 4 and its collector terminal to the supply voltage terminal 104. The additional output 140 is connected via the emitter terminal of the transistor 141 and a separating diode 142, which is constituted by a transistor which is short-circuited between the base and the collector terminal.

Figure 2:
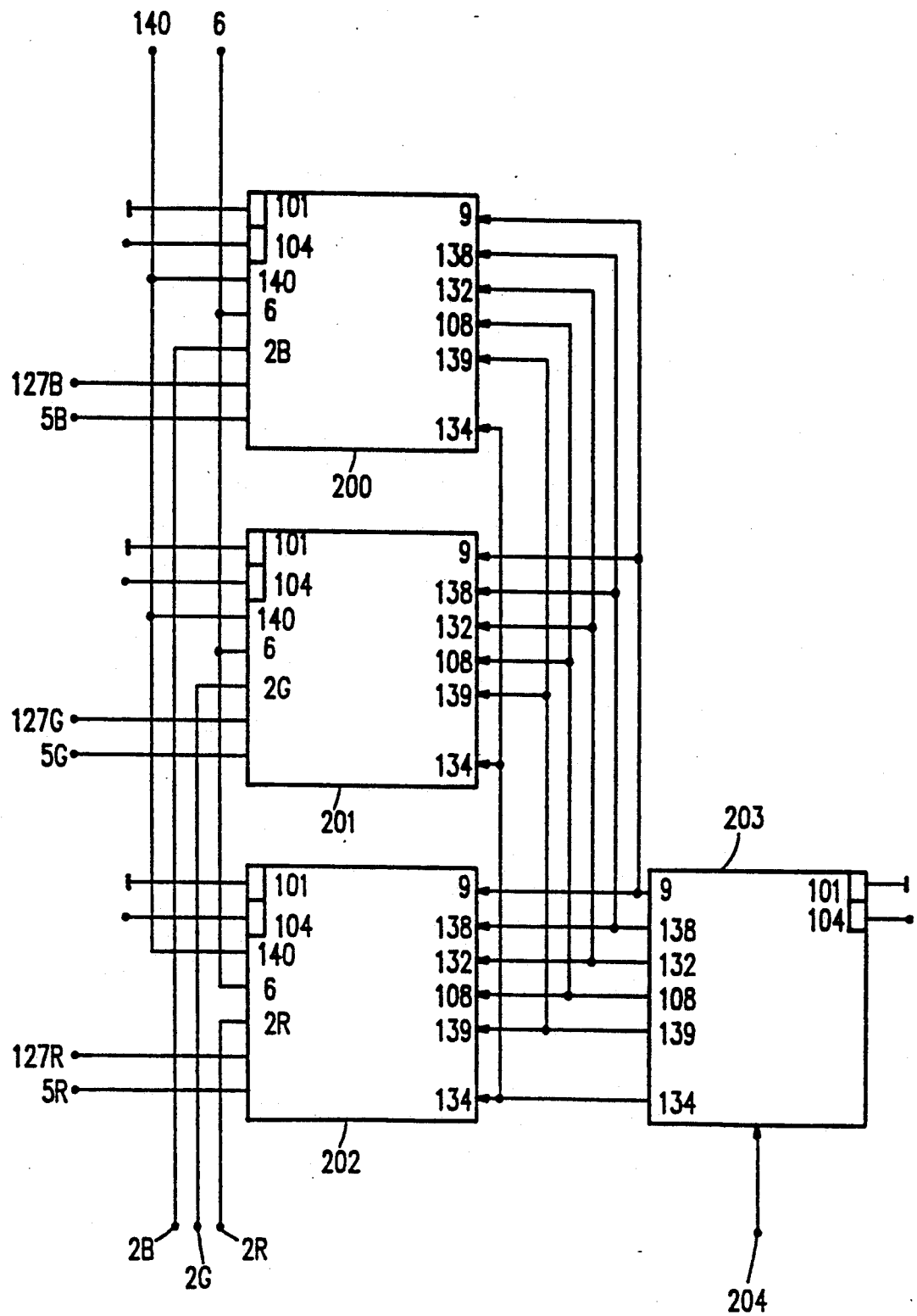
FIG. 2 shows a general view of an embodiment.

FIG. 2 shows the use of a circuit arrangement in accordance with the invention in a signal output stage for video signal processing. For each of the three colour signals a current amplifier with associated circuit arrangement shown in FIG. 3 is provided for amplifying the respective, associated signals; in FIG. 2 these components of FIG. 3 are given the reference numerals 200 for the amplifying device for the blue colour signal, 201 for the green colour signal and 202 for the red colour signal. The terminals of these colour signal amplifiers 200, 201 and 202 are given the same reference numerals as in FIGS. 1 and 3; terminals used in common by the three components have also been given the same reference numerals, while all the terminals which are provided individually for each component and are not interconnected between the components are given the reference numerals known froms FIGS. 1 and 3 completely by the letters B, G or R, respectively, (for blue, green and red). In this combination of the three colour signal amplifiers 200, 201, 202 the control terminal 9 and also the reference voltage terminals 108, 132, 134 as well as 138, 139 of the three components are always interconnected, in addition to the grounded terminal 101 and the power supply terminal 104, and are supplied from a voltage generating stage 203, whose terminals are referenced correspondingly. The example of FIG. 3 further shows the special case in which only the first signal inputs 2B, 2G and 2R are structured as separate inputs for the three colour signals to be amplified. In contrast thereto, the second signal inputs 6 of the colour signal amplifiers 200, 201, 202 are connected to a common terminal. In the present embodiment, a predetermined d.c. voltage which in the colour signal amplifiers 200, 201, 202 is applied substantially unchanged to the signal outputs 5B, 5G and 5R, respectively, via this terminal 6. This d.c. voltage is used more specifically as the so-called white signal for heating the picture tube which is energised by the video signal output stage shown in FIG. 2. To that end an associated signal voltage having a value between 3 and 7 V is preferably applied to the second signal current input 6.

In contrast thereto, the current setting inputs 127B, 127G and 127R of the three colour signal amplifiers 200, 201, 202 are separated from each other, so that for each colour component of the video signal a separate adjustment is possible. In the present case the current setting input 127 is preferably used for adjusting the black level in the video signal to be displayed. More specifically, via the current setting inputs a three-fold control circuit can be formed which provides the control of the dark currents in the picture tubes.

The voltage generating stage 203 further has a switching input 204 to which a switching voltage is applied from which a voltage for the control terminal 9 is derived in the voltage generating stage 203.

Figure 4:
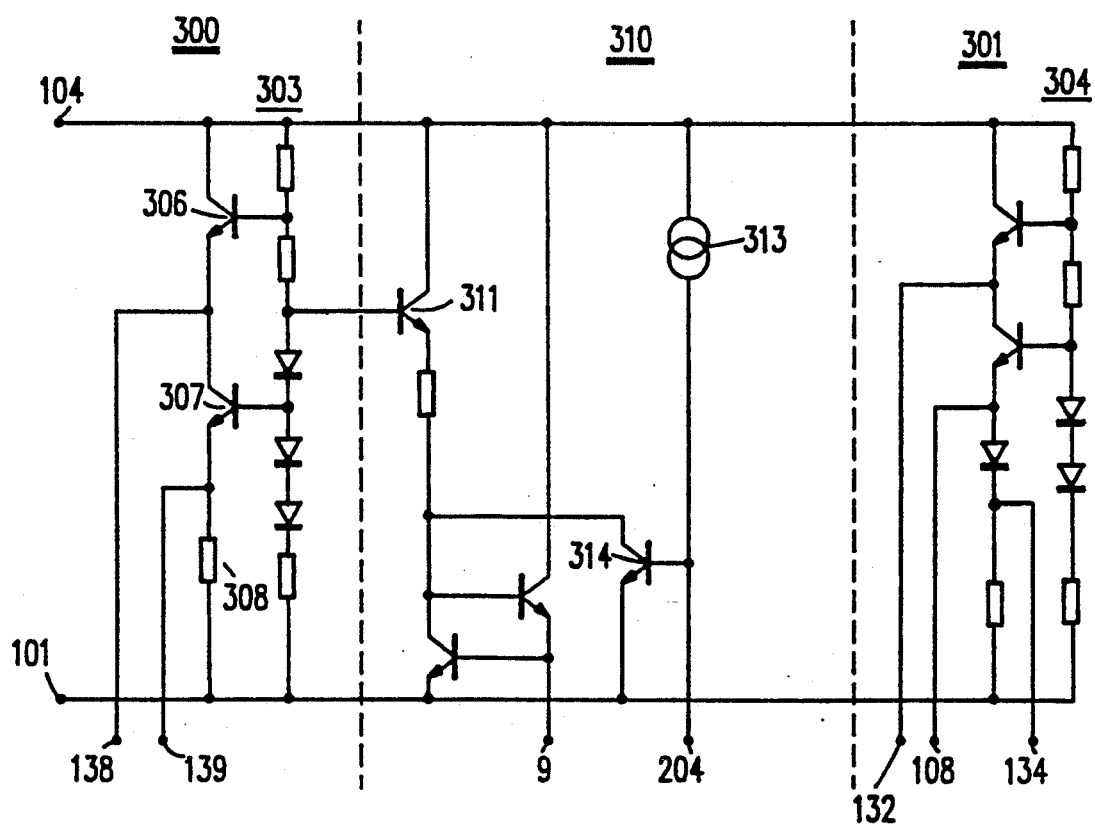
FIG. 4 shows a reference and switching signal processing stage usable in the circuit arrangement of FIG. 2.

FIG. 4 shows a detailed circuit diagram of an embodiment of a voltage generating stage 203 for use in a circuit arrangement as shown in FIG. 2. The voltage generating stage 203 is divided into two reference divider stages 300, 301, which are each individually arranged for deriving individual reference voltages from a voltage divider arranged between the power supply terminal 104 and the grounded terminal 101. The first voltage divider 303 of the reference divider stage 300 is formed by a series arrangement of three ohmic resistors and three diodes, the first two elements—taken from the power supply terminal 104—are resistors, followed by the three diodes. Taps which are connected to base terminals of transistors 306, 311, 307 are provided directly after the first three elements of the first voltage divider 303. The transistors 306, 307 connected to the first and the third taps form together with their collector-emitter paths and an emitter resistor 308 connected to the grounded terminal 101 a series arrangement between ground and the power supply terminal 104. The reference voltages derived via the reference voltage terminals 138 and 139 are taken in a low-ohmic manner under the control of the first voltage divider 303 from the junction points between these transistors 306, 307 and their associated emitter resistor 308.

The reference divider stage 301 is structured similarly, the difference being that only the first diode in the first voltage divider 303 is omitted and instead thereof a diode is inserted between the second transistor (corresponding to 307) and the emitter resistor (corresponding to 308). The elements of the branches of the collector-emitter paths of the transistors now form three taps which are connected to the terminals 108, 132 and 134 for the constant reference potential at the base terminal of the transistor 107 in FIG. 3 as well as the reference voltages to the transistors 133 and 131.

In addition, the voltage generating stage 203 includes a control signal stage 310, to which via the switching input 204 a switching signal can be applied which after having been inverted can be applied via the control terminal 9 which is also connected to the control signal stage 310, to the components 200, 201, 202 for switching between the two signal inputs 2 and 6, respectively. The control signal stage 310 includes a current source transistor 311, whose base terminal is supplied from a tap of the first voltage divider 303 of the reference divider stage 300 between the first—taken in a direction from the power supply terminal 104—two resistors and the subsequent diodes. The emitter terminal of the current source transistor 311 is connected via an emitter resistor to an output stage for the control terminal 9 and to the collector terminal of a switching transistor 314, whose emitter terminal is connected to the grounded terminal 101 and whose base terminal is connected to the switching input 204. For feeding the base terminal of the switching transistor 314 a current source 313 is connected to the power supply terminal 104. The current source 313 can be of a similar structure as the current source transistor 311 and be driven in the same way by the reference divider stage 300.

I claim:

1. A circuit arrangement for selectively amplifying one of at least two signals to produce an amplified signal, said circuit arrangement comprising an amplifier and a switchable path interruption for applying at least one of said at least two signals to said amplifier, wherein when said switchable path interruption is non-conducting, a signal voltage associated with said one signal to be amplified and a signal voltage associated with said amplified signal are applied to respective ends of said switchable path interruption, and further comprising a switching arrangement assuming a conduction state opposite to that of the signal path interruption, said signal voltage associated with said amplified signal being applied to one end of said switchable path interruption via said switching arrangement.

2. A circuit arrangement as claimed in claim 1, wherein said one signal to be amplified is a voltage signal which is applied to one end of said switching arrangement via said switchable path interruption when said switching arrangement is non-conducting.

3. A circuit arrangement as claimed in claim 1, wherein when said signal voltage associated with said one signal to be amplified leaves a predetermined value range, said switchable path interruption is made conducting when the switching arrangement is conducting.

* * * * *